United States Patent [19]

Okanobu

[11] Patent Number: 5,584,066

[45] Date of Patent: Dec. 10, 1996

[54] CORRECTING CIRCUIT FOR MIXING CIRCUIT RECEIVER USING SAME AND FREQUENCY SPECTRUM INVERTING CIRCUIT USING SAME

[75] Inventor: Taiwa Okanobu, Tokyo, Japan

[73] Assignee: Sony Corporation, Tokyo, Japan

[21] Appl. No.: 320,040

[22] Filed: Oct. 7, 1994

[30]   Foreign Application Priority Data

Oct. 8, 1993   [JP]   Japan ..................... 5-277641

[51] Int. Cl.$^6$ .............................. H04B 1/04; H04B 1/10
[52] U.S. Cl. ...................... 455/302; 455/114; 455/118; 455/310; 332/123
[58] Field of Search ............................. 455/232.1, 234.1, 455/234.2, 250.1, 296, 307, 310, 311, 302, 313, 317, 114, 118, 314, 324, 226.2, 303, 319, 326, 50.1, 63; 375/296; 331/10–12; 332/103, 123, 126, 127; 329/318, 319, 320, 325, 304

[56]   References Cited

U.S. PATENT DOCUMENTS

| | | | |
|---|---|---|---|
| 4,121,161 | 10/1978 | Ohsawa | 455/234.1 |
| 4,355,414 | 10/1982 | Inoue | 455/250.1 |
| 4,811,425 | 3/1989 | Feerst | 455/317 |
| 5,001,776 | 3/1991 | Clark | 455/226.2 |
| 5,012,208 | 4/1991 | Makinen et al. | 332/123 |
| 5,283,532 | 2/1994 | Burkhart et al. | 455/250.1 |
| 5,396,196 | 3/1995 | Blodgett | 332/123 |

FOREIGN PATENT DOCUMENTS

0124608   5/1990   Japan ..................... 455/317

*Primary Examiner*—Reinhard J. Eisenzopf
*Assistant Examiner*—Nguyen Vo
*Attorney, Agent, or Firm*—Lise A. Rode, Esq.; Jerry A. Miller

[57]   ABSTRACT

A double superheterodyne receiver comprising a pair of first mixer circuits, a pair of second mixer circuits, a demodulator circuit, and a pair of detector circuits. The first mixer circuits are connected in an orthogonal relation to each other and acts to convert a received RF signal into a pair of first intermediate-frequency (IF) signals in the baseband. The second mixer circuits are connected in an orthogonal relation to each other and acts to convert the first IF signals into a pair of second IF signals of a given center frequency. The demodulator circuit arithmetically combines the second IF signals so as to create a third IF signal, and demodulates the original signal from the third IF signal. The output signals from the second mixer circuits are supplied to the detector circuits, which in turn detect the carrier component contained in the output signals. The output signals from the detector circuits are fed to the second mixer circuits. The DC balance between the second mixer circuits is so corrected that the leaking carrier components are reduced.

14 Claims, 8 Drawing Sheets

CORRECTING CIRCUIT FOR MIXING CIRCUIT RECEIVER USING SAME AND FREQUENCY SPECTRUM INVERTING CIRCUIT USING SAME

BACKGROUND OF THE INVENTION

1. Field of the Invention

The present invention relates to a correcting circuit for a mixer circuit, to a receiver using such a correcting circuit, and to a frequency spectrum-inverting circuit using such a correcting circuit. More particularly, the invention relates to a correcting circuit which is for use with a mixing circuit and acts to reduce carrier leakage, to a receiver and a frequency spectrum-inverting circuit using such a correcting circuit.

2. Background of the Invention

Figure 1:
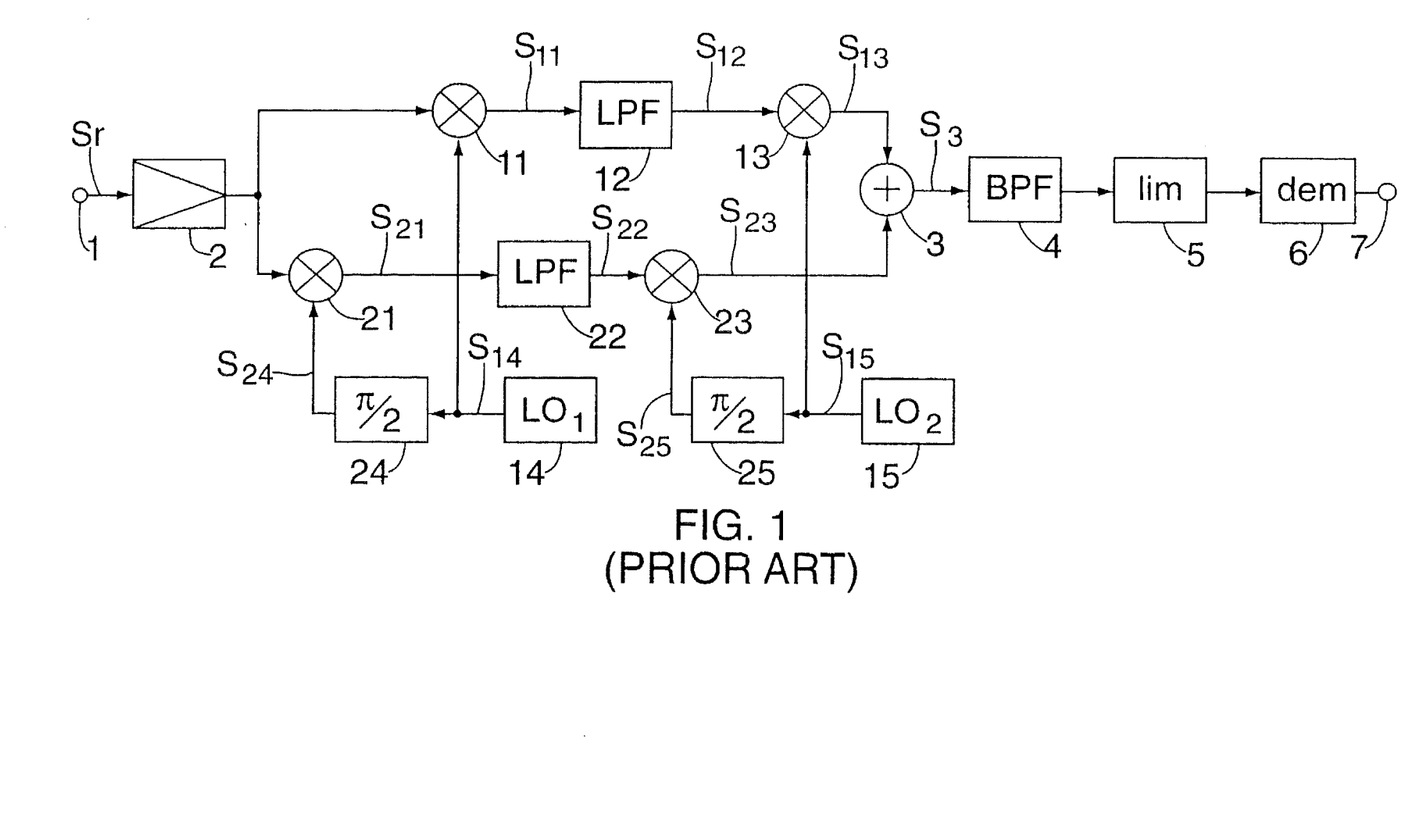
FIG. 1 is a block diagram of a conventional double superheterodyne receiver.

One known superheterodyne receiver is a double superheterodyne, direct-conversion type receiver as shown in FIG. 1. This receiver performs its first and second frequency conversions, utilizing orthogonal conversion, to improve the image rejection characteristics. This receiver operates as follows.

The receiver shown in FIG. 1 constitutes the receiver portion of a cordless telephone set, and receives an FM signal. The FM signal, Sr, to be received is applied to its input terminal 1 and fed to first mixer circuits 11 and 21, for I-axis and Q-axis, respectively, for orthogonal conversion via an RF amplifier 2.

A first local oscillator circuit 14 produces a first local oscillator signal $S_{14}$ having the same frequency as the carrier frequency of the received signal Sr. This signal $S_{14}$ is applied to the mixer circuit 11 and also to a phase-shift circuit 24, where the signal is shifted in phase by $\pi/2$, resulting in a phase-shifted signal $S_{24}$. This signal $S_{24}$ is supplied as the first local oscillator signal to the mixer circuit 21.

Figure 2A:
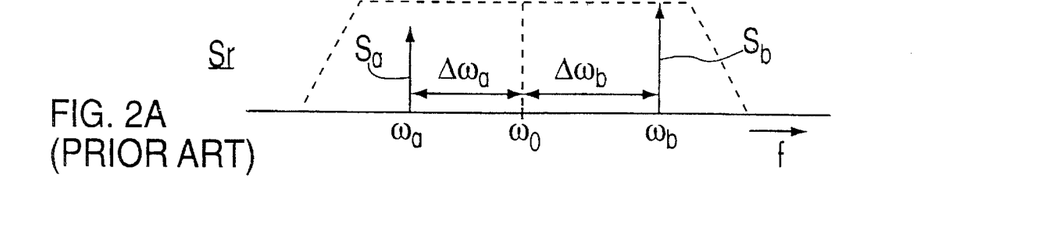
FIG. 2A is a frequency spectrum of a signal received by the receiver shown in FIG. 1.

For simplicity, it is assumed that the received signal Sr has a signal component Sa within its lower sideband and a signal component Sb within its upper sideband, as shown in FIG. 2A, where $\omega_0$ is the carrier frequency (angular frequency) of the received signal Sr, $\omega_a$, is the angular frequency ($\omega_a < \omega_0$) of the signal component Sa, Ea is the amplitude of the signal component Sa, $\omega_b$ is the angular frequency ($\omega_a > \omega_0$) of the signal component Sb, $E_b$ is the amplitude of the signal component $S_b$, $\Delta\omega_a = \omega_0 - \omega_a$, and $\Delta\omega_b = \omega_b - \omega_0$. We can have the relations $$Sr = Sa + Sb$$

$$Sa = Ea \cdot \sin \omega_a t$$

$$Sb = Eb \cdot \sin \omega_b t$$

Assuming that $E_1$ is the amplitude of the first local oscillator signals $S_{14}$ and $S_{24}$, we have the relationships $$S_{14} = E_1 \cdot \sin \omega_0 t$$

$$S_{24} = E_1 \cdot \cos \omega_0 t$$

Let $S_{11}$ and $S_{12}$ be the output signals from the mixer circuits 11 and 21, respectively. These output signals can be expressed in the manner described below.

$$\begin{aligned}
S_{11} &= Sr \cdot S_{14} \\
&= (Ea \cdot \sin \omega_a t + Eb \cdot \sin \omega_b t) \times E_1 \cdot \sin \omega_0 t \\
&= \alpha a \{-\cos(\omega_a + \omega_0)t + \cos(\omega_0 - \omega_a)t\} + \\
&\quad \alpha b \{-\cos(\omega_b + \omega_0)t + \cos(\omega_b - \omega_0)t\} \\
&= \alpha a \{-\cos(\omega_a + \omega_0)t + \cos \Delta\omega_a t\} + \\
&\quad \alpha b \{-\cos(\omega_b + \omega_0)t + \cos \Delta\omega_b t\}
\end{aligned}$$

$$\begin{aligned}
S_{21} &= Sr \cdot S_{24} \\
&= (Ea \cdot \sin \omega_a t + Eb \cdot \sin \omega_b t) \times E_1 \cdot \cos \omega_0 t \\
&= \alpha a \{\sin(\omega_a + \omega_0)t - \sin(\omega_0 - \omega_a)t\} + \\
&\quad \alpha b \{\sin(\omega_b + \omega_0)t + \sin(\omega_b - \omega_0)t\} \\
&= \alpha a \{\sin(\omega_a + \omega_0)t - \sin \Delta\omega_a t\} + \\
&\quad \alpha b \{\sin(\omega_b + \omega_0)t + \sin \Delta\omega_b t\}
\end{aligned}$$

$$\alpha a = Ea \cdot E_1/2$$
$$\alpha b = Eb \cdot E_1/2$$

Of the above formulas, the signal components of the angular frequencies $\Delta\omega_a$ and $\Delta\omega_b$ are desired intermediate frequencies and so these signals $S_{11}$ and $S_{21}$ are supplied to low-pass filters 12 and 22, respectively. The signal components of the angular frequencies $\Delta\omega_a$ and $\Delta\omega_b$ are taken out as first intermediate-frequency signals $S_{12}$ and $S_{22}$, respectively. Thus, we have $$S_{12} = \alpha a \cdot \cos \Delta\omega_a t + \alpha b \cdot \cos \Delta\omega_b t$$

$$S_{22} = -\alpha a \cdot \sin \Delta\omega_a t + \alpha b \cdot \sin \Delta\omega_b t$$

In this case, as can be seen from FIG. 2A, the signals $S_{12}$ and $S_{22}$, are signals in the baseband.

These signals $S_{12}$ and $S_{22}$ are supplied to second mixer circuits 13 and 23, respectively, for I-axis and Q-axis, respectively, for orthogonal conversion. A comparatively low-frequency, second local oscillator signal $S_{15}$ is taken from a second local oscillator circuit 15. This signal $S_{15}$ is fed to the mixer circuit 13 and also to a phase-shift circuit 25, where the signal is shifted in phase by $\pi/2$. The phase-shifted signal is supplied as the second local oscillator signal to the mixer circuit 23. Accordingly, we have $$S_{15} = E_2 \cdot \sin \omega_s t$$

$$S_{25} = E_2 \cdot \cos \omega_s t$$

where $E_2$, is the amplitude of the second local oscillator signals $S_{15}$ and $S_{25}$ and $\omega_s = 2\pi f_s$. For example, $f_s$ is 55 kHz. Let $S_{13}$ and $S_{14}$ be the output signals from the mixer circuits 13 and 23, respectively. Thus, $$\begin{aligned}
S_{13} &= S_{12} \cdot S_{15} \\
&= (\alpha a \cdot \cos \Delta\omega_a t + \alpha b \cdot \cos \Delta\omega_b t) \times E_2 \cdot \sin \omega_s t \\
&= \beta a \{\sin(\Delta\omega_a + \omega_s)t - \sin(\Delta\omega_a - \omega_s)t\} + \\
&\quad \beta b \{\sin(\Delta\omega_b + \omega_s)t - \sin(\Delta\omega_b - \omega_s)t\}
\end{aligned}$$

$$\begin{aligned}
S_{23} &= S_{22} \cdot S_{25} \\
&= (-\alpha a \cdot \sin \Delta\omega_a t + \alpha b \cdot \sin \Delta\omega_b t) \times E_2 \cdot \cos \omega_s t \\
&= -\beta a \{\sin(\Delta\omega_a + \omega_s)t + \sin(\Delta\omega_a - \omega_s)t\} + \\
&\quad \beta b \{\sin(\Delta\omega_b + \omega_s)t + \sin(\Delta\omega_b - \omega_s)t\}
\end{aligned}$$

$$\beta a = \alpha a \cdot E_2/2$$
$$\beta b = \alpha b \cdot E_2/2$$

By modifying these signals $S_{13}$ and $S_{23}$ in such a way that any frequency difference does not assume a negative value, we have $$
\begin{aligned}
S_{13} &= \beta a \{\sin(\Delta\omega_a + \omega_s)t + \sin(\omega_s - \Delta\omega_a)t\} + \\
&\quad \beta b \{\sin(\Delta\omega_b + \omega_s)t + \sin(\omega_s - \Delta\omega_b)t\} \\
&= \beta a \cdot \sin(\omega_s + \Delta\omega_a)t + \beta a \cdot \sin(\omega_s - \Delta\omega_a)t\} + \\
&\quad \beta b \cdot \sin(\omega_s + \Delta\omega_b)t + \beta b \cdot \sin(\omega_s - \Delta\omega_b)t\} \\
S_{23} &= -\beta a \{\sin(\Delta\omega_a + \omega_s)t - \sin(\omega_s - \Delta\omega_a)t\} + \\
&\quad \beta b \{\sin(\Delta\omega_b + \omega_s)t - \sin(\omega_s - \Delta\omega_b)t\} \\
&= -\beta a \cdot \sin(\omega_s + \Delta\omega_a)t + \beta a \cdot \sin(\omega_s - \Delta\omega_a)t\} + \\
&\quad \beta b \cdot \sin(\omega_s + \Delta\omega_b)t - \beta b \cdot \sin(\omega_s - \Delta\omega_b)t\}
\end{aligned}
$$

These signals $S_{13}$ and $S_{23}$ are supplied to an adder circuit 3, where they are summed up. The adder circuit 3 produces a sum signal given by $$
\begin{aligned}
S_3 &= S_{13} + S_{23} \\
&= 2\beta a \cdot \sin(\omega_s - \Delta\omega_a)t + 2\beta b \cdot \sin(\omega_s + \Delta\omega_b)t
\end{aligned}
$$

Figure 2B:
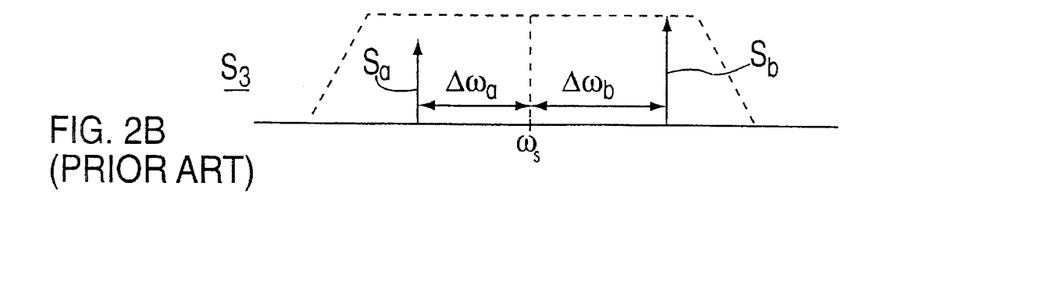
FIG. 2B is a frequency spectrum of an output signal from an adder included in the receiver shown in FIG. 1.

This sum signal $S_3$ is illustrated in FIG. 2B. This signal $S_3$ is obtained by converting the original signal Sr into a signal of the carrier frequency, or the angular frequency $\omega_s$. That is, the signal $S_3$ is a second intermediate-frequency signal of intermediate frequency $f_s$.

This second intermediate-frequency signal $S_3$ is supplied via an IF bandpass filter 4 and via a limiter amplifier 5 to an FM demodulator circuit 6, where the original signal is demodulated. This audio signal appears at an output terminal 7.

If the adder circuit 3 does not produce the sum of the signals $S_{13}$ and $S_{23}$ but performs a subtraction, then $$
\begin{aligned}
S_{img} &= S_{13} - S_{23} \\
&= 2\beta a \cdot \sin(\omega_s - \Delta\omega_a)t + 2\beta b \cdot \sin(\omega_s + \Delta\omega_b)t
\end{aligned}
$$

This signal Simg is a signal having a distribution that is an inversion of the frequency spectrum of the above-described original second intermediate-frequency signal $S_3$ in the frequency band occupied by this signal $S_3$, i.e., the signal Simg is an image interference signal.

In an ordinary FM receiver, this intermediate frequency is set to 10.7 MHz. Therefore, the intermediate-frequency filter is inevitably made of a ceramic filter. This makes it impossible to fabricate the circuit as an IC. In the above-described receiver, however, the first intermediate-frequency (IF) signals $S_{12}$ and $S_{22}$ are in the baseband. Consequently, the second IF frequency $f_s$ can be set to a low value, e.g., 55 kHz. Hence, each of the filters 12, 22, and 4 can consist of an active filter made up of resistors, capacitors, and an amplifier. Thus, the portions from the terminal 1 to the terminal 7, including the filters 12, 22, and 4, can be integrated into one monolithic IC chip.

The receiver of the construction described above cannot be put into practical use because it has two great problems. The first one arises because the second mixer circuits 13 and 23 do not operate ideally. In particular, some of the second local oscillator signals $S_{15}$ and $S_{25}$ leak to the adder circuit 3 through the mixer circuits 13 and 23, thus causing trouble.

Figure 3:
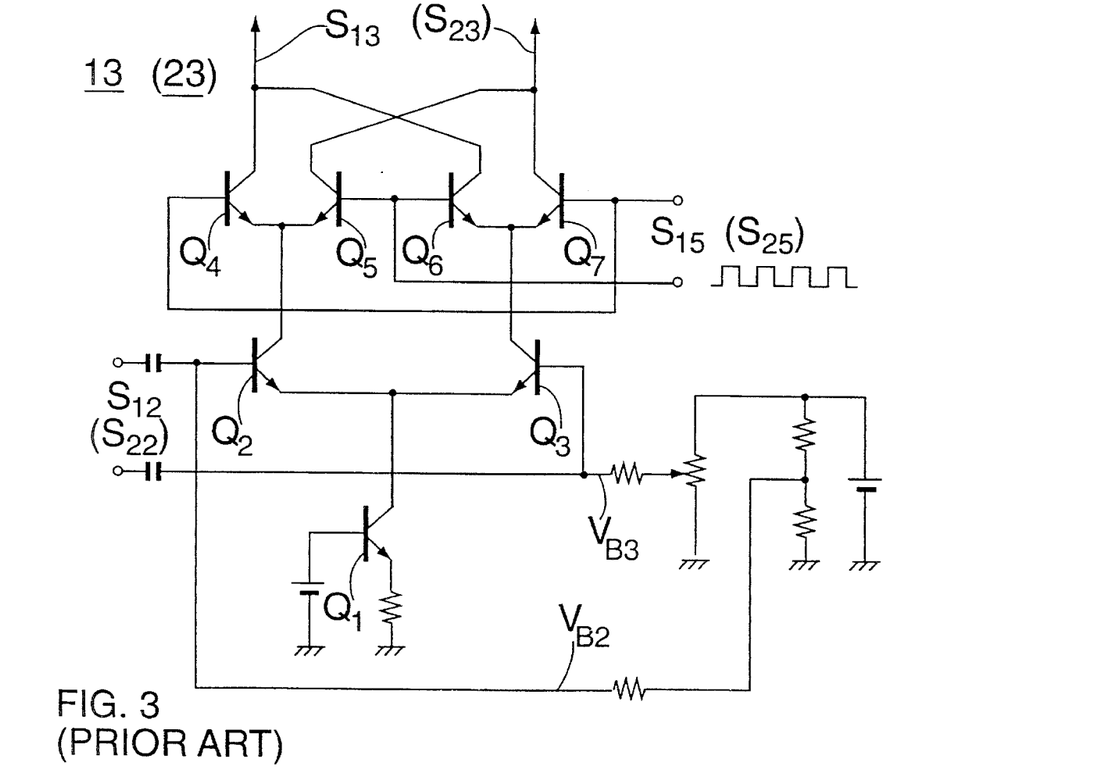
FIG. 3 is a circuit diagram of mixer circuits included in the receiver shown in FIG. 1.

More specifically, each of the mixer circuits 13 and 23 is generally made of a double balanced switching circuit, or a balanced modulator circuit, as shown in FIG. 3. The first IF signal $S_{12}$ or $S_{22}$ is supplied across the bases of lower transistors $Q_2$ and $Q_3$. The rectangular second local oscillator signal $S_{15}$ or $S_{25}$ is supplied across the bases of upper transistors $Q_4$ and $Q_5$ and across the bases of upper transistors $Q_6$ and $Q_7$. The signal $S_{12}$ produced from the collectors of the transistors $Q_2$ and $Q_3$ is chopped by the signal $S_{15}$.

The second IF signal $S_{13}$ or $S_{23}$ is taken from the collectors of the transistors $Q_4$–$Q_7$.

In this case, if the characteristics of the transistors $Q_1$–$Q_7$ and their DC biases are completely balanced against each other, then only the desired second IF signal $S_{13}$ is produced from the transistors $Q_4$–$Q_7$. In practice, however, the characteristics of the transistors $Q_1$–$Q_7$ and their DC biases are not matched, in which case the second IF signal $S_{13}$ produced from the transistors $Q_4$–$Q_7$ contains a carrier component, or a component of the second local oscillator signal $S_{15}$. That is, carrier leakage occurs.

Accordingly, it is common practice to adjust the bias voltage $V_{B3}$ applied to the base of the transistor $Q_3$ so as to minimize the carrier leakage, based on the voltage $V_{B2}$ applied to the base of the transistor $Q_2$, as shown in FIG. 3.

In this method, each individual receiver is required to be adjusted. This deteriorates the productivity of receivers. If the ambient temperature around the receiver varies, the optimally adjusted point changes and so temperature compensation is needed. This compensation is not easy to perform.

One effective method of maintaining the accuracy of the balance between the characteristics of the transistors and between the DC biases is to fabricate components as an IC. However, if the mixer circuits 13 and 23 shown in FIG. 3 is fabricated as an IC, carrier can be suppressed to about 40–50 dB at best. If the carrier leakage is suppressed further, external adjustment is yet needed.

If the carrier signal leaks from the mixer circuits 13 and 23 in this way, the carrier frequency is $f_2$ and equal to the second intermediate frequency $f_2$ in the case of the receiver shown in FIG. 1. Therefore, it is very difficult to separate the second IF signal $S_3$ from the leaking carrier component. As a result, if automatic gain control (AGC) is provided, the level of the received electric field is displayed, and tuning is indicated, then malfunctions will occur. Furthermore, the leaking carrier component beats with the second IF signal $S_3$, thus deteriorating the reception characteristics.

The second problem arises from the fact that the first IF signals $S_{12}$ and $S_{22}$ are in the baseband. That is, if the received signal Sr has a large level, then it cannot be treated. More specifically, in the receiver shown in FIG. 1, in the signal intervals between the first mixer circuits 11, 21 and the second mixer circuits 13, 23, respectively, the following relation holds:

first intermediate frequency≦frequencies of signal components

Therefore, even where the received signal Sr is an FM signal, if the first IF signals $S_{12}$ and $S_{22}$ are clipped, information is lost during this interval. It follows that the signals $S_{12}$ and $S_{22}$ are sampled at a frequency lower than the frequencies of these signals. As a result, beating and distortions take place.

SUMMARY OF THE INVENTION

It is, therefore, an object of the present invention to provide a double superheterodyne receiver which is free of the above-mentioned problems.

It is another object of the invention to provide a frequency spectrum-inverting circuit which is free of the above-mentioned problems.

It is a further object of the invention to provide a mixer circuit-correcting circuit which is free of the above-mentioned problems.

According to one aspect of the present invention, there is provided a double superheterodyne receiver comprising a pair of first mixer circuits, a pair of second mixer circuits, a demodulator circuit, and a pair of detector circuits. The first mixer circuits are connected in an orthogonal relation to each other, and convert a received RF signal into a pair of first IF signals in the baseband. The second mixer circuits are connected in an orthogonal relation to each other, and convert the first IF signals into a pair of second IF signals of a given center frequency. The demodulator circuit arithmetically combines the second IF signals so as to create a third IF signal and demodulates the original signal from the third IF signal. The output signals from the second mixer circuits are supplied to the detector circuits, which in turn detect a leaking carrier component contained in the output signals. The output signals from the detector circuits are fed to the second mixer circuits. The DC balance between the second mixer circuits is so corrected that the leaking carrier component is reduced.

According to another aspect of the present invention, there is provided a double superheterodyne receiver comprising a pair of first mixer circuits, a pair of second mixer circuits, a demodulator circuit, a pair of detector circuits, and a microprocessor. The first mixer circuits are connected in an orthogonal relation to each other, and convert a received RF signal into a pair of first IF signals in the baseband. The second mixer circuits are connected in an orthogonal relation to each other, and convert the first IF signals into second IF signals of a given center frequency. The demodulator circuit arithmetically combines the second IF signals so as to create a third IF signal and demodulates the original signal from the third IF signal. The output signals from the second mixer circuits are supplied to the detector circuits, which in turn detect a carrier component contained in the output signals. The DC balance between the second mixer circuits is so corrected that a leaking carrier component is reduced. Circuit components from the first mixer circuits to the demodulator circuit are formed by the microprocessor.

According to still another aspect of the present invention, there is provided a frequency spectrum-inverting circuit comprising a carrier signal-generating circuit, a balanced modulator circuit, and a detector circuit. The carrier signal-generating circuit produces a carrier signal. The balanced modulator circuit receives the carrier signal from the carrier signal-generating circuit and a modulating audio signal whose bandwidth is limited. The detector circuit receives the output signal from the balanced modulator circuit and detects the leaking carrier component contained in the output signal. The output signal from the detector circuit is supplied to the balanced modulator circuit. The DC balance in the balanced modulator circuit is so corrected that the leaking carrier component decreases.

According to yet another aspect of present invention, there is provided a mixer circuit-correcting circuit comprising a double balanced modulator circuit and a detector circuit. The double balanced modulator circuit receives a carrier signal, converts the frequency of the input signal into a second frequency, and delivers an output signal of this second frequency. The detector circuit receives the output signal from the double balanced modulator circuit and detects a leaking carrier component contained in the output signal. The output signal from the detector circuit is supplied to the double balanced modulator circuit. The DC balance in the balanced modulator circuit is so corrected that the leaking carrier component decreases.

In the present invention, leakage of the carrier signal from the mixer circuits is reduced greatly. Consequently, various troubles which would normally be caused by the carrier leakage can be prevented.

Other objects and features of the invention will appear in the course of the description thereof, which follows.

BRIEF DESCRIPTION OF THE DRAWINGS

The invention will be more readily understood with reference to the accompanying drawings, wherein.

DETAILED DESCRIPTION OF THE INVENTION

Figure 4:
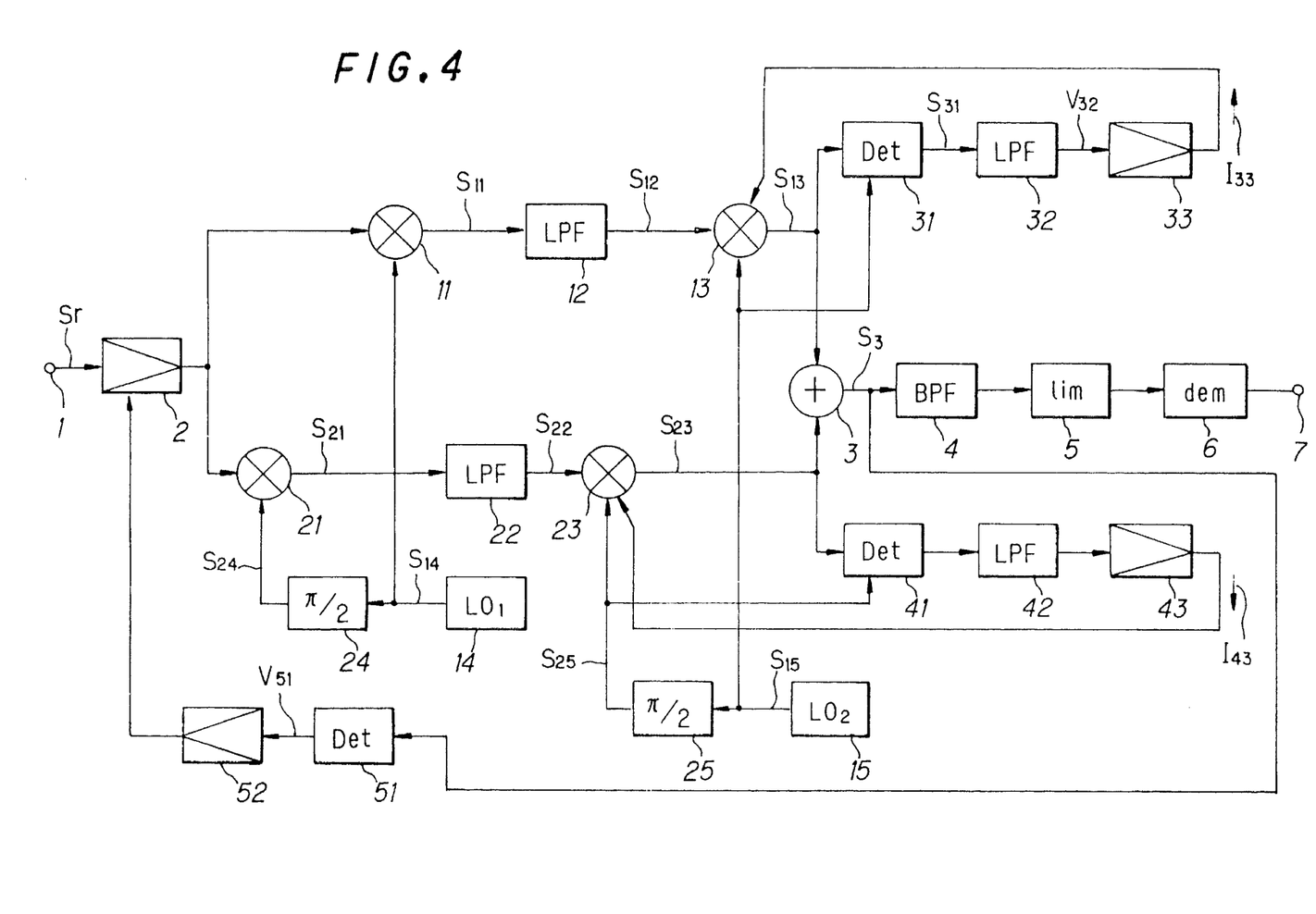
FIG. 4 is a block diagram of a double superheterodyne receiver according to the present invention.
Figure 5:
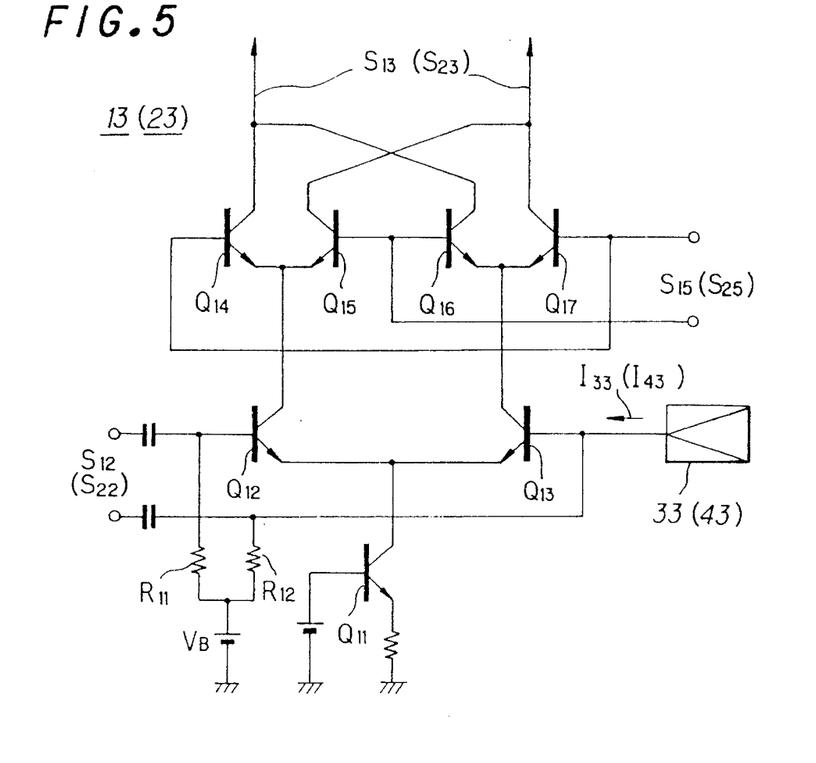
FIG. 5 is a circuit diagram of mixer circuits included in the receiver shown in FIG. 4.

The structures of receivers according to the present invention are hereinafter described by referring to the accompanying drawings. It is to be noted that like components are indicated by like reference numerals in various figures and that those components which have been already described in connection with FIG. 1 will not described in detail below. Referring to FIG. 4, there is shown a receiver embodying the concept of the present invention. This receiver has a reception portion for receiving a signal Sr. The reception portion starting with an input terminal 1 and ending with an output terminal 7 is similar to the reception portion of the receiver shown in FIG. 1. Second mixer circuits 13 and 23 are each composed of a double balanced switching circuit consisting of transistors $Q_{11}$–$Q_{17}$ as shown in FIG. 5, in the similar way as the mixer circuit shown in FIG. 3. The transistors $Q_{12}$ and $Q_{13}$ to which first IF signal $S_{12}$ or $S_{22}$ is supplied receive equal base bias voltage $V_B$ via resistors $R_{11}$ and $R_{12}$, respectively.

In accordance with the present invention a synchronous detector circuit 31 is provided as a circuit for detecting a carrier component leaking from the mixer circuit 13. The output signal $S_{13}$ from the mixer circuit 13 is supplied as a detected input signal to the synchronous detector circuit 31. The second local oscillator signal $S_{15}$ from a local oscillator circuit 15 is fed as a reference signal to the synchronous detector circuit 31. The output signal from the synchronous detector circuit 31 is supplied to a low-pass filter 32.

The output voltage $V_{32}$ from the low-pass filter 32 is fed to a regulated-current circuit or an amplifier 33 having a large output resistance, so that the voltage $V_{32}$ is converted into an electrical current $I_{33}$. This current $I_{33}$ is furnished to the base of the transistor $Q_{13}$, for example, of the second mixer circuit 13 shown in FIG. 5. It will be understood, however, that output voltage $V_{32}$ may also be used to control the DC balance in the second mixer circuit 13.

Similarly, a synchronous detector circuit 41 is provided as a circuit for detecting a carrier component leaking from the mixer circuit 23. The output signal $S_{23}$ from the mixer circuit 23 is supplied as a detected input signal to the synchronous detector circuit 41. A phase-shifted signal $S_{25}$ from a phase-shift circuit 25 is supplied as a reference signal to the synchronous detector circuit 41. The output signal from the synchronous detector circuit 41 is fed to a low-pass filter 42, which in turn produces a given DC voltage. This DC voltage is fed to a regulated current circuit or to an amplifier 43 having a large output resistance, whereby the DC voltage is converted into an electrical current $I_{43}$. This current $I_{43}$ is supplied to the base of one transistor $Q_{13}$ of the second mixer circuit 23.

The second IF signal $S_3$ from the adder circuit 3 is fed to a level detector circuit 51, which in turn produces a delayed AGC voltage $V_{51}$. This delayed AGC voltage $V_{51}$ is supplied to an amplifier 2 via an amplifier 52 to control the gain of the amplifier 2.

Figure 6A:
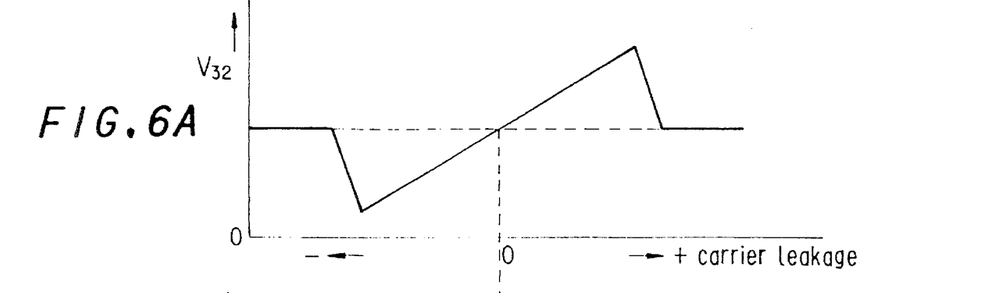
FIG. 6A is a waveform diagram illustrating a DC voltage $V_{32}$ produced from one low-pass filter included in the receiver shown in FIG. 4.

In this structure, if a carrier component leaks from the mixer circuit 13, the synchronous detector circuit 31 detects the leaking carrier component synchronously with the second local oscillator signal $S_{15}$ of the same frequency as the leaking carrier component. As a result, the low-pass filter 32 produces the DC voltage $V_{32}$ whose level varies depending on the phase, i.e., on whether the leaking carrier component is in phase or 180°-out of phase, and in response to the magnitude, as shown in FIG. 6A.

Figure 6B:
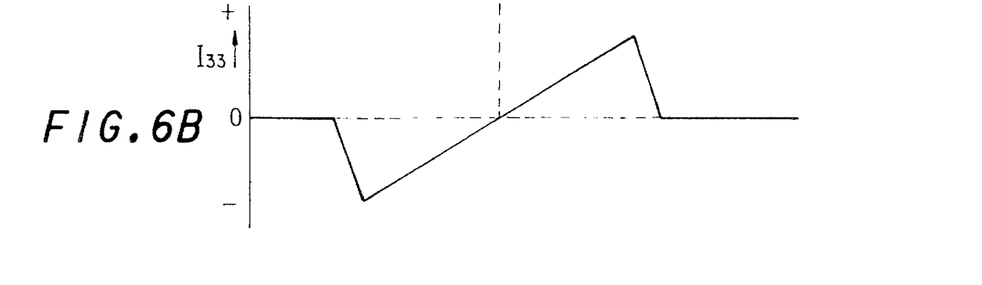
FIG. 6B is a waveform diagram illustrating an electrical current $I_{33}$ produced from one amplifier included in the receiver shown in FIG. 4.

This DC voltage $V_{32}$ is converted into the electrical current $I_{33}$ changing as shown in FIG. 6B by the amplifier 33. This current $I_{33}$ is fed to the base of the transistor $Q_{13}$. Therefore, if the leaking carrier component is in phase, the current $I_{33}$ increases the base current of the transistor $Q_{13}$. Conversely, if the leaking carrier component is 180° -out of phase, the current $I_{33}$ reduces the base current for the transistor $Q_{13}$. At this time, the amount by which the base current increases or decreases corresponds to the magnitude of the current $I_{33}$. Accordingly, the DC balance between the transistors $Q_{12}$ and $Q_{13}$ is corrected by the current $I_{33}$ in the same way as the voltage $V_{B3}$ shown in FIG. 3. This greatly reduces the carrier component leaking from the mixer circuit 13.

Likewise, the output current $I_{43}$ from the amplifier 43 corrects the DC balance between the transistors $Q_{12}$ and $Q_{13}$ of the mixer circuit 23. In consequence, the carrier component leaking from the mixer circuit 23 is reduced greatly.

In this case, the circuit for reducing the leaking carrier component forms a negative loop. Let $G_{NF}$ be the gain of this loop. The amplitude of the leaking carrier component is reduced by a factor of $G_{NF}$ compared with the amplitude of the leaking carrier component produced where no negative loop is formed as shown in FIG. 1. For example, let the loop gain $G_{NF}$ be 100. The magnitude of the leaking carrier component is reduced by a factor of 100. Thus, an improvement of 40 dB is accomplished.

The first problem, i.e., generation of a carrier component leaking from the mixer circuits 13 and 23, is reduced greatly. As a result, various troubles which would normally arise from the carrier leakage can be prevented. Where AGC is provided, the level of the received electric field is displayed, and tuning is indicated, these functions can be performed correctly. Furthermore, the leaking carrier component does not beat with the second IF signal $S_3$; thus preventing the deterioration of the reception characteristics.

The first IF signals $S_{12}$ and $S_{22}$ have the above-described relations with the second IF signal $S_3$ and so the level of the signal $S_3$ corresponds to the levels of the signals $S_{12}$ and $S_{22}$. Since the leakage of the carrier component from the mixer circuits 13 and 23 can be neglected as mentioned previously, the AGC using the AGC voltage $V_{51}$ can be properly performed.

Accordingly, the level of the received signal Sr is controlled under the AGC so that the level of the second IF signal $S_3$ is kept constant. The levels of the first IF signals $S_{12}$ and $S_{22}$ are also maintained constant. As a result, even if the level of the received signal Sr applied to the input terminal 1 is large, the first IF signals $S_{12}$ and $S_{22}$ are not clipped. Hence, neither beating nor distortions are produced. In this way, the second-mentioned problem can be solved. The signal Sr which is received at a high level can be received with good characteristics.

Figure 7:
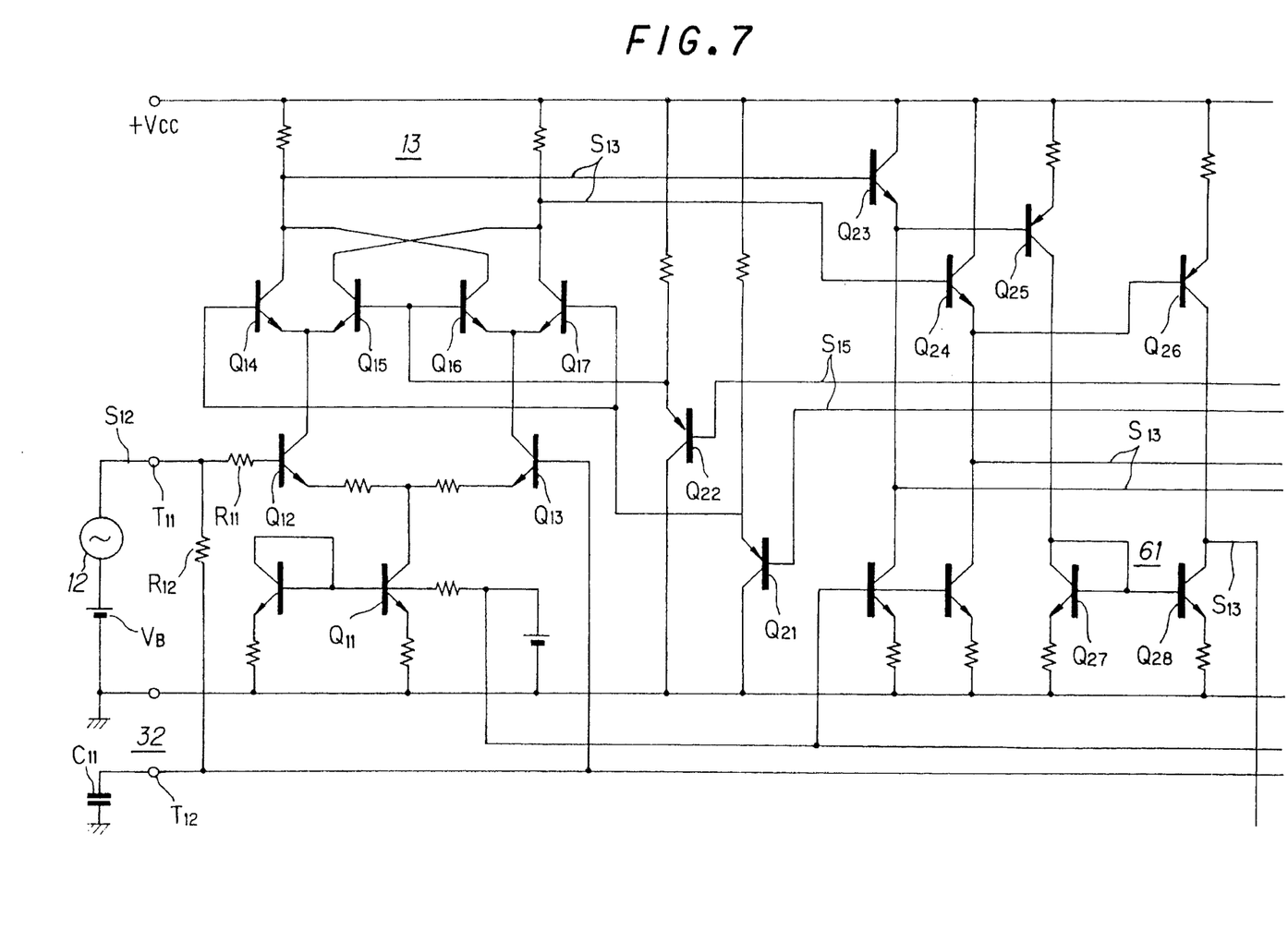
FIGS. 7–9 are circuit diagrams of carrier leakage-reducing circuit portions included in the receiver shown in FIG. 4.
Figure 8:
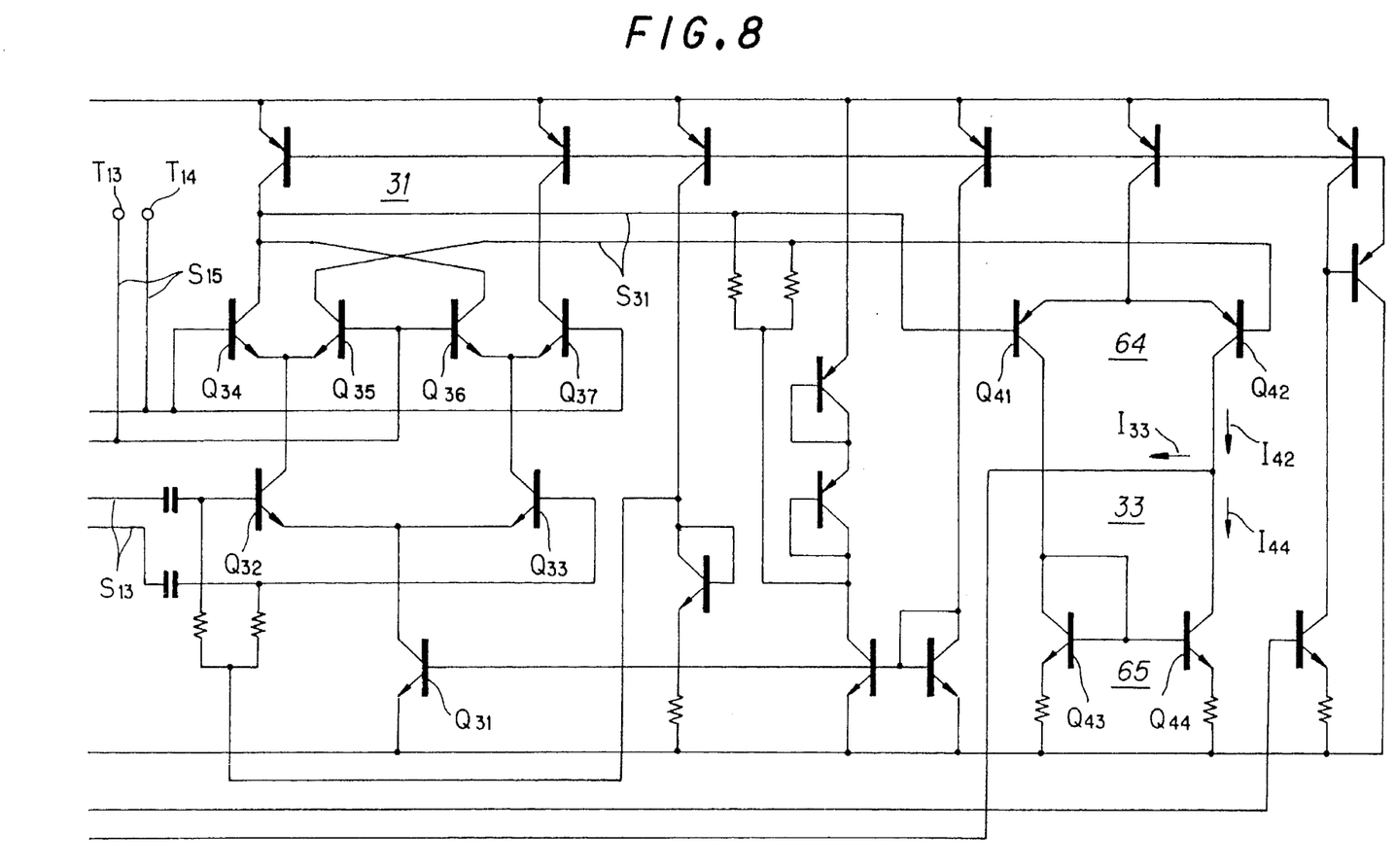
Figure 9:
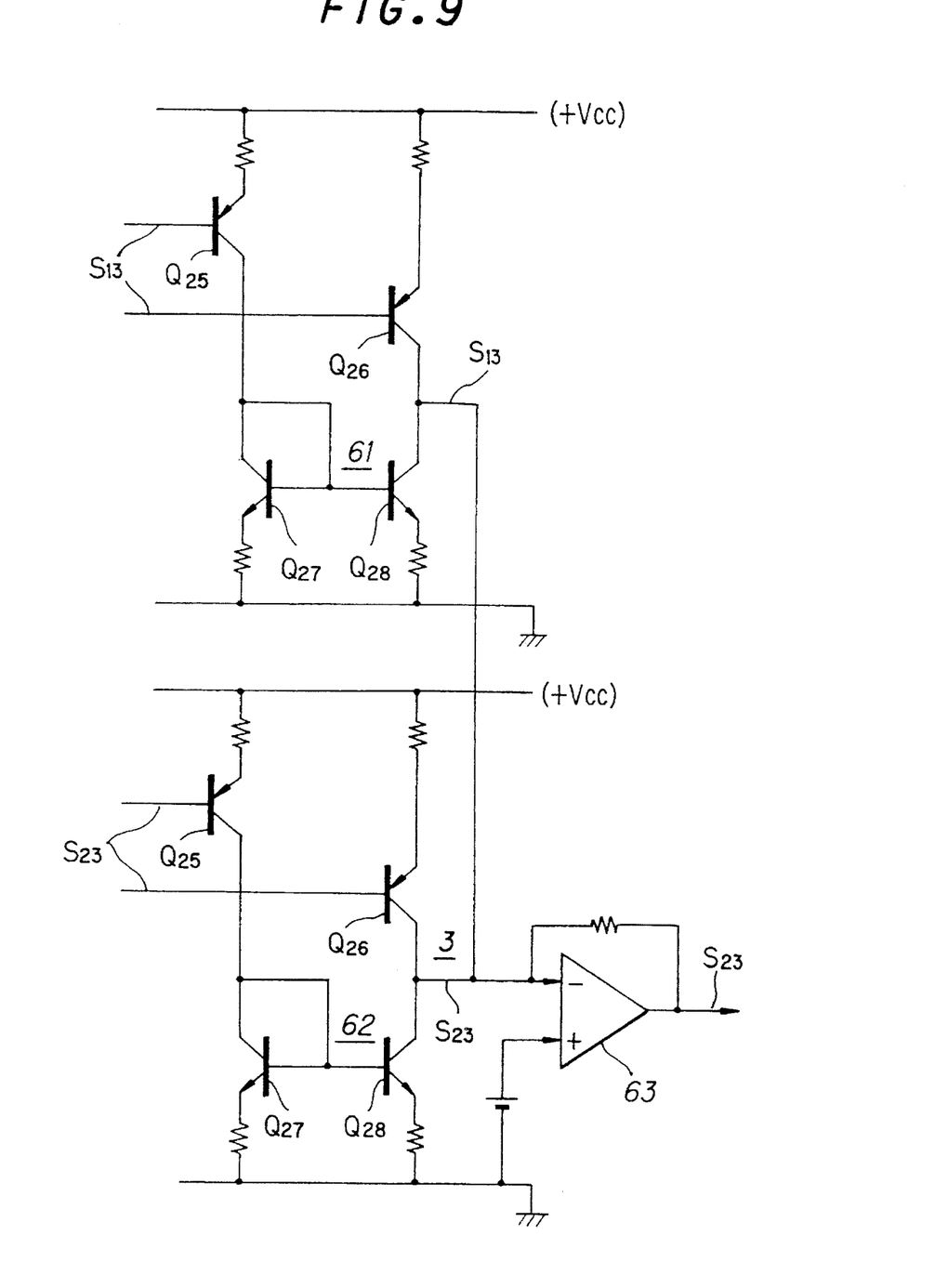

FIGS. 7–9 show an example of an IC forming the aforementioned circuit for reducing the leaking carrier component. This example is divided into several parts in these figures. Some parts are shown in both FIGS. 7 and 9.

A first IF signal $S_{12}$ and a DC bias voltage $V_B$ are supplied from a terminal $T_{11}$ to the base of the transistor $Q_{12}$ of the second mixer circuit 13 through a resistor $R_{11}$. The terminal $T_{11}$ is connected with the base of the transistor $Q_{13}$ via a resistor $R_{12}$. An external capacitor $C_{11}$ is connected between this base of the transistor $Q_{13}$ and ground via a terminal $T_{12}$. This capacitor $C_{11}$ forms a bypass line from the base of the transistor $Q_{13}$ in terms of AC signals as viewed from the first IF signal $S_{12}$. Furthermore, the capacitor $C_{11}$ forms a part of the low-pass filter 32.

A balanced second local oscillator signal $S_{15}$ is supplied between the bases of the transistors $Q_{14}$ and $Q_{17}$ and the bases of the transistors $Q_{15}$ and $Q_{16}$ through transistors $Q_{21}$ and $Q_{22}$ of an emitter follower from the terminals $T_{13}$ and $T_{14}$. A balanced second IF signal $S_{13}$ is taken from between the collectors of transistors $Q_{14}$ and $Q_{16}$ and the collectors of the transistors $Q_{15}$ and $Q_{17}$.

This signal $S_{13}$ is supplied to transistors $Q_{27}$ and $Q_{28}$ of a current mirror circuit 61 via the emitter-grounded transistors $Q_{25}$ and $Q_{26}$ and via the transistors $Q_{23}$ and $Q_{24}$ of the emitter follower. In this way, the signal $S_{13}$ is converted into an unbalanced signal $S_{13}$. The second IF signal $S_{23}$ is processed similarly and converted into an unbalanced signal $S_{23}$ by a current mirror circuit 62.

The output terminals of the current mirror circuits 61 and 62 are tied together to form the adder circuit 3 and to produce the second IF signal $S_3$. This signal $S_3$ is supplied to the following stage (not shown) via a buffer amplifier 63.

Transistors $Q_{31}$–$Q_{37}$ together form the double balanced synchronous detector circuit 31. The output signal $S_{13}$, or the second IF signal, from the second mixer circuit 13 is supplied to the bases of the transistors $Q_{33}$ and $Q_{32}$ via the transistors $Q_{23}$ and $Q_{24}$. The second local oscillator signal $S_{15}$ is fed between the bases of the transistors $Q_{34}$ and $Q_{37}$ and the bases of the transistors $Q_{35}$ and $Q_{36}$ from the terminals $T_{13}$ and $T_{14}$. In this manner, a balanced synchronously detected signal $S_{31}$ is taken from the collectors of the transistors $Q_{34}$ and $Q_{36}$ and from the collectors of the transistors $Q_{35}$ and $Q_{37}$.

This synchronously detected signal $S_{31}$ is supplied to the bases of transistors $Q_{41}$ and $Q_{42}$ which together form a differential amplifier 64. Transistors $Q_{43}$ and $Q_{44}$ which together form a current mirror circuit 65 are connected to the collector of the amplifier 64. The differential amplifier 64 and the current mirror circuit 65 together form the amplifier 33. In the amplifier 33, the following relation holds:

$$I_{33}=I_{42}-I_{44}$$

where $I_{42}$ and $I_{44}$ are the collector currents for the transistors $Q_{42}$ and $Q_{44}$, respectively.

The output terminal of the amplifier 33 is connected to the base of the transistor $Q_{13}$. In this case, the output impedance of the amplifier 33 and a capacitor $C_1$ together form the low-pass filter 32.

Therefore, if the carrier component does not leak from the second mixer circuit 13, then $S_{31}=0$. Thus, $$I_{42}=I_{44}$$

This leads to $$I_{33}=0$$

That is, if no carrier component leaks from the second mixer circuit 13, an equal base current is supplied to the transistors $Q_{12}$ and $Q_{13}$.

However, if carrier leakage from the second mixer circuit 13 takes place, either the relationship $S_{31}>0$ or the relationship $S_{31}<0$ holds. Hence, $$I_{42}>I_{44} \text{ or } I_{42}<I_{44}$$

Thus, we have $$I_{33}>0 \text{ or } I_{33}<0$$

At this time, the magnitude, or the absolute value, of the current $I_{33}$ corresponds to the magnitude of the leaking carrier component.

Accordingly, if carrier leakage from the second mixer circuit 13 occurs, the base current for the transistor $Q_{12}$ does not vary but the base current for the transistor $Q_{13}$ increases or decreases, depending on the phase of the leaking carrier component. The amount of the increase or decrease corresponds to the magnitude of the leaking carrier component. That is, the DC balance in the second mixer circuit 13 is corrected by the current $I_{33}$ and, therefore, the generated carrier leakage is reduced greatly. Carrier leakage from the second mixer circuit 23 is similarly reduced greatly in a manner not illustrated.

In the foregoing case, carrier leakage from the second mixer circuits 13 and 23 of the receiver of a cordless telephone set is reduced. In cordless telephones, in order to prevent eavesdropping, the frequency spectrum of the transmitted and received audio signal is inverted. The above-described technique for reducing carrier leakage is also suited for inversion of the frequency spectrum of the audio signal.

Figure 10:
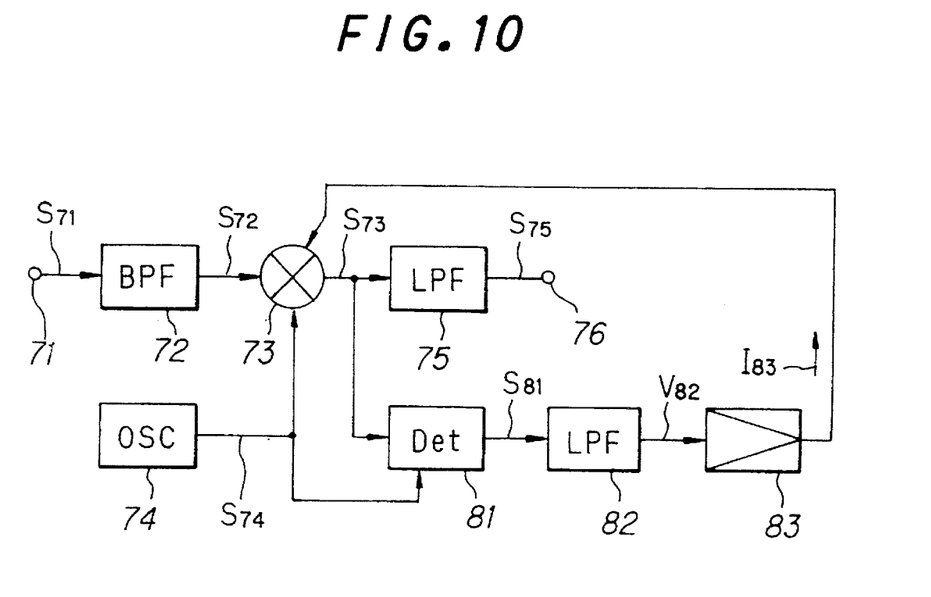
FIG. 10 is a block diagram of a frequency spectrum-inverting circuit according to the invention.

FIG. 10 shows an example in which the frequency spectrum is inverted. An audio signal $S_{71}$ is supplied from a terminal 71 to a bandpass filter 72, which in turn produces a signal $S_{72}$ of frequency components of 300 Hz to 3 kHz, for example. This signal $S_{72}$ is supplied as a modulating input signal to a balanced modulator circuit 73. A carrier signal generator circuit 74 produces a carrier signal $S_{74}$ of a frequency of 3.5 kHz, for example, and is fed to the modulator circuit 73. Thus, the modulator circuit 73 produces a DSB signal $S_{73}$ balance-modulated by the signal $S_{72}$.

This signal $S_{73}$ is fed to a low-pass filter 75, so that of the signal $S_{73}$, the lower sideband signal, i.e., signal $S_{75}$ obtained by inverting the frequency spectrum of the signal $S_{72}$, is taken from a terminal 76.

In this case, if the balanced modulator circuit 73 is an ideal circuit, then the carrier signal $S_{74}$ does not leak into the output signal $S_{73}$ from the modulator circuit 73. In practice, however, the carrier signal $S_{74}$ leaks because of imbalance between devices and imbalance between DC biases. That is, the output signal $S_{73}$ contains a leaking carrier component. In order to remove this leaking carrier component, the cutoff characteristic curve of the low-pass filter 75 must be steep. In consequence, the low-pass filter 75 is required to have very high orders.

The signal $S_{73}$ from the balanced modulator circuit 73 is supplied as a detected input signal to a synchronous detector circuit 81. The carrier signal $S_{74}$ is supplied as a reference signal to the detector circuit 81. The signal $S_{73}$ is detected in synchronism with the signal $S_{74}$. The output signal $S_{81}$ from the synchronous detector circuit 81 is fed to a low-pass filter 82, so that the signal $S_{81}$ is converted into a DC voltage corresponding to the phase and the amplitude of the leaking carrier component. This voltage $V_{82}$ is supplied to an amplifier 83, where the input voltage $V_{82}$ is converted into a DC current $I_{33}$. Then, this DC current $I_{83}$ is fed back to the balanced modulator circuit 73 as a signal for controlling the DC balance.

Therefore, the output signal $S_{73}$ from the balanced modulator circuit 73 ceases to contain the leaking carrier component. This makes it unnecessary that the cutoff characteristic curve of the low-pass filter 75 be very steep. Consequently, it is only necessary that the filter 75 have low orders. This permits miniaturization of the telephone set. Furthermore, the cost can be curtailed.

In the examples described in connection with FIGS. 7–9, the output signal $S_{31}$ from the synchronous detector circuit 31 is supplied to the amplifier 33 having the differential amplifier 64 and the current mirror circuit 65 to create the electrical current $I_{33}$. Alternatively, a current mirror circuit may be connected as a load to the synchronous detector circuit 31 to obtain the current $I_{33}$.

In the above-described example, the voltage $V_{32}$ is converted into the current $I_{33}$, which is in turn used to control the DC balance in the second mixer circuit 13. It is also possible to control the balance according to the voltage $V_{32}$.

It is to be understood that the present invention is not limited to the foregoing structures and that various changes and modifications are possible within the scope of the invention which is delineated by the following claims.

What is claimed is:

1. A double superheterodyne receiver comprising:

a pair of first mixer circuits connected in an orthogonal relation to each other and acting to convert a received RF signal into first intermediate-frequency signals in a baseband;

a pair of second mixer circuits connected in an orthogonal relation to each other and acting to convert said first intermediate-frequency signals into second intermediate-frequency signals of a desired center frequency;

a demodulator circuit for arithmetically combining said second intermediate-frequency signals so as to create a third intermediate-frequency signal and for a demodulating an original signal from said third intermediate-frequency signal; and, a pair of detector circuits receiving output signals from said pair of second mixer circuits and acting to detect a leaking carrier component contained in said output signals from said pair of second mixer circuits, said detector circuits producing output signals having the same phase as said leaking carrier component, wherein said output signals from said detector circuits are provided to said pair of second mixer circuits to correct DC balance between said pair of second mixer circuits so that said leaking carrier component is reduced.

2. The double superheterodyne receiver of claim 1, wherein each of said detector circuits includes a synchronous detector circuit, said output signals from said pair of said second mixer circuits being fed as detected input signals to said synchronous detector circuits, and wherein a local oscillator signal supplied to said second mixer circuits is supplied as a reference signal to said synchronous detector circuits.

3. The double superheterodyne receiver of claim 1, further comprising a level control portion for detecting a level of said third intermediate-frequency signal and for controlling a level of said received RF signal according to the detected level.

4. The double superheterodyne receiver of claim 1, further comprising filters for passing said first and second intermediate frequency signals.

5. A double superheterodyne receiver comprising:
- a pair of first mixer circuits connected in an orthogonal relation to each other and acting to convert a received RF signal into a pair of first intermediate-frequency signals in a baseband;
- a pair of second mixer circuits connected in an orthogonal relation to each other and acting to convert said first intermediate-frequency signals into second intermediate-frequency signals of a desired center frequency;
- a demodulator circuit for arithmetically combining said second intermediate-frequency signals so as to create a third intermediate-frequency signal and for demodulating an original signal from said third intermediate-frequency signal, wherein at least said first mixer circuits and said demodulator circuit are formed on an integrated circuit; and,
- a pair of detector circuits receiving output signals from said second mixer circuits and acting to detect a leaking carrier component contained in said output signals from said second mixer circuits, said detector circuits producing output signals having the same phase as said leaking carrier component, wherein said output signals from said detector circuits are provided to said second mixer circuits to correct DC balance between said second mixer circuits in such a way that said leaking carrier component is reduced.

6. The double superheterodyne receiver of claim 5, further comprising a level control portion for detecting a level of said third intermediate-frequency signal and for controlling a level of said received RF signal according to the detected level.

7. The double superheterodyne receiver of claim 5, further comprising filters for passing said first and second intermediate-frequency signals, and wherein each of said filters consists of an active filter.

8. A circuit for inverting a frequency spectrum, comprising:
- a carrier signal-generating circuit for producing a carrier signal;
- a balanced modulator circuit receiving said carrier signal from said carrier signal-generating circuit and an audio signal as a modulating input signal, said audio signal having a limited bandwidth; and,
- a detector circuit receiving an output signal from said balanced modulator circuit and acting to detect a leaking carrier component contained in said output signal from said balanced modulator circuit, said detector circuit producing an output signal having the same phase as said leaking carrier component, wherein said output signal from said detector circuit is provided to said balanced modulator circuit to correct DC balance in said balanced modulator circuit in such a way that said leaking carrier component decreases.

9. A circuit for inverting a frequency spectrum as set forth in claim 8, wherein said detector circuit comprises a synchronous detector circuit receiving said output signal from said balanced modulator circuit, and wherein said carrier signal from said carrier signal-generating circuit is supplied as a reference signal to said synchronous detector circuit.

10. A circuit for inverting a frequency spectrum as set forth in claim 9, wherein said detector circuit further comprises a low-pass filter for receiving an output signal from said synchronous detector circuit.

11. A circuit for inverting a frequency spectrum as set forth in claim 10, wherein said output signal from said synchronous detector circuit is supplied to said balanced modulator circuit via said low-pass filter.

12. A correcting circuit for a mixer circuit, comprising:
- a double balanced modulator circuit receiving a carrier signal and acting to convert a frequency of an input signal into a second frequency and to produce a first output signal of said second frequency; and,
- a detector circuit receiving said output signal from said double balanced modulator circuit and acting to detect a leaking carrier component contained in said output signal, said detector circuit producing an output signal having the same phase as said leaking carrier component, wherein said output signal from said detector circuit is provided to said double balanced modulator circuit to correct DC balance in said double balanced modulator circuit in such a way that said leaking carrier component decreases.

13. A correcting circuit for a mixer circuit as set forth in claim 12, further comprising a carrier signal-generating circuit, wherein said detector circuit is equipped with a synchronous detector circuit receiving said output signal from said double balanced modulator circuit, and wherein said carrier signal from said carrier signal-generating circuit is supplied as a reference signal to said synchronous detector circuit.

14. A correcting circuit for a mixer circuit as set forth in claim 13, wherein said detector circuit is equipped with a low-pass filter receiving an output signal from said synchronous detector circuit, and wherein said output signal from said synchronous detector circuit is supplied to said double balanced modulator circuit via said low-pass filter.

* * * * *